(12) United States Patent
Kayanuma

(10) Patent No.: US 8,517,571 B2
(45) Date of Patent: Aug. 27, 2013

(54) LENS MEMBER AND OPTICAL UNIT INCLUDING THE SAME

(75) Inventor: Yasuaki Kayanuma, Fujiyoshida (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 196 days.

(21) Appl. No.: 12/986,431

(22) Filed: Jan. 7, 2011

(65) Prior Publication Data

US 2011/0216543 A1 Sep. 8, 2011

(30) Foreign Application Priority Data

Jan. 10, 2010 (JP) ................................. 2010-003476

(51) Int. Cl.
*F21V 3/00* (2006.01)

(52) U.S. Cl.
USPC ...... 362/311.01; 362/308; 362/327; 359/642; 359/709

(58) Field of Classification Search
USPC ............ 362/311.01, 311.06–311.1; 359/362, 359/642, 678, 707–709, 741–743
See application file for complete search history.

(56) References Cited

U.S. PATENT DOCUMENTS

| | | | | |
|---|---|---|---|---|
| 7,224,537 B2 * | 5/2007 | Choi | ............................. | 359/707 |
| 2003/0235050 A1 * | 12/2003 | West et al. | ..................... | 362/327 |
| 2007/0041098 A1 * | 2/2007 | Kim et al. | ..................... | 359/642 |
| 2008/0297918 A1 * | 12/2008 | Park et al. | ..................... | 359/709 |
| 2010/0284194 A1 | 11/2010 | Miyashita et al. | | |

FOREIGN PATENT DOCUMENTS

| | | |
|---|---|---|
| JP | 57-55002 | 4/1982 |
| JP | 59-119340 | 7/1984 |
| JP | 5-281402 | 10/1993 |

* cited by examiner

*Primary Examiner* — Donald Raleigh
(74) *Attorney, Agent, or Firm* — Wenderoth, Lind & Ponack, L.L.P.

(57) ABSTRACT

A lens member of obtaining light-collecting properties even if using a light source with a large light-emitting surface area has a first lens portion refracting light to exit outward in radial directions perpendicular to a central axis of the lens member and a second lens portion totally internally reflecting the light that exited through the first lens portion. The first lens portion has a light incident surface disposed to face a light source and a conical light exit surface centered at the central axis of the lens member and slanted so that the distance between the conical surface and the light incident surface increases as the distance from the central axis increases outward in the radial directions perpendicular to the central axis. The second lens portion has an inner circumferential surface receiving light from the first lens portion and an outer circumferential surface positioned outward of the inner circumferential surface in the radial directions perpendicular to the central axis. The outer circumferential surface totally reflects light received through the inner circumferential surface in a direction away from the first lens portion toward the second lens portion in parallel to the direction of extension of the central axis.

19 Claims, 7 Drawing Sheets

PRIOR ART

LENS MEMBER AND OPTICAL UNIT INCLUDING THE SAME

This application claims priority under 35 U.S.C. §119 to Japanese Patent application No. JP2010-003476 filed on Jan. 10, 2010, the entire contents of which are hereby incorporated by reference.

TECHNICAL FIELD

The present invention relates to a lens member and an optical unit usable for lighting and so forth.

BACKGROUND OF THE INVENTION

There are various narrow-directivity optical devices such as light-emitting diode (LED) optical products including lighting devices, projectors, flashlights, and headlights and taillights for use in automobiles and such a device usually includes a lens used to collect or collimate light emitted from a light source. Usually, a convex-shaped refraction lens is used as such a light-collecting or collimating lens. FIG. 14 shows a conventional TIR (Total Internal Reflection) lens member 1 which has been developed as a lens superior in light-collecting properties. The lens member 1 has a central axis AX and has a hollow portion centered at the central axis AX and an outer circumferential surface 1a positioned outward of the hollow portion in radial directions perpendicular to the central axis AX. A light source 2 with its light-emitting surface facing the lens member 1 is disposed and the center of the light-emitting surface is aligned to coincide with the central axis AX of the lens member 1 that receives light emitted from the light source 2. Of the light, light rays emitted with tilts tilting closer to the radial directions relative to the central axis AX and received through an inner circumferential surface 1b that is a circumferential surface of the hollow portion of the lens member 1 are totally reflected at the outer circumferential surface 1a and exited from a light exit surface 1c of the lens member 1 toward the direction of extension of the central axis AX. It should be noted that the central axis AX is an imaginary line passing through the center of the lens member 1.

Japanese Patent Application Publication Nos. 1982-55002, 1984-119340 and 1993-281402 propose TIR lenses made in the form of a Fresnel lens in order to achieve reductions in height and thickness.

Since light emitted from a light source with a large light-emitting surface is more spreading than light from a light source with a small light-emitting surface, the conventional TIR lens shown in FIG. 14, for example, has the following problem. Accordingly, even if a light source is arranged with its emitted light passing through such a TIR lens, light-collecting efficiency with the TIR lens is decreased when a light source with a large light-emitting surface is used. In particular, when a light source including a plurality of LED elements arranged in plane is used as the light source 2, since the plurality of LED elements individually emit light and all together constitute a light-emitting surface of the light source 2, the light-emitting surface inevitably become large and it becomes difficult to achieve an efficient light-collecting or collimating effect with such a conventional lens.

SUMMARY OF THE INVENTION

The present invention has been made in view of the above-described circumstances.

Accordingly, an object of the present invention is to provide a lens member with light-collecting effect even if used with a light source including a plurality of LED elements or including a large light-emitting surface.

Another object of the present invention is to provide an optical unit including the lens member of the present invention.

The present invention provides a lens member including a central axis, a first lens portion, and a second lens portion. The first lens portion includes a light incident surface disposed to face a light source, and a light exit surface opposite to the light incident surface. The light exit surface includes a conical surface centered at the central axis and slanted so that a distance between the conical surface and the light incident surface increases as a distance from the central axis increases outward in radial directions perpendicular to the central axis. The second lens portion includes an inner circumferential surface extending around the central axis from the outer circumferential edge of the conical surface of the first lens portion, and an outer circumferential surface centered at the central axis and positioned outward of the inner circumferential surface in the radial directions perpendicular to the central axis.

In the lens member, light rays from the light source emitted at tilt angles that tilt closer to the radial directions than the central axis AX enter the first lens portion through the light incident surface of the first lens portion. The radial directions are perpendicular to the central axis AX. The light rays entered the first lens portion are refracted at a conical surface that constitutes a light exit surface of the first lens portion with more added tilt angles than the tilt angles of light rays with the tilt angles and just emitted from the light source mentioned above. The light rays exiting the first lens portion enter the second lens portion 12 through the inner circumferential surface 12c of the second lens portion 12. The light rays are eventually totally reflected at the outer circumferential surface 12a of the second lens portion 12 and thus directed parallel to the central axis AX to exit from the light exit surface 12b of the second lens portion 12. Consequently, the light rays can exit from the light exit surface 12b of the second lens portion in the state of being more converged than when entering the first lens portion.

Specifically, the inner circumferential surface of the second lens portion may be a circular cylindrical surface extending substantially parallel to the central axis from the outer circumferential edge of the conical surface of the first lens portion.

The outer circumferential surface of the second lens portion may slant at an angle set between the central axis and the radial directions perpendicular to the central axis. In other words, the outer circumferential surface of the second lens portion may include a shape of cone that spreads or opens in a direction of the central axis of the lens member, the direction being away from the light incident surface of the first lens portion.

Light rays emitted from the light source at tilt angles closer to the radial directions perpendicular to the central axis AX than the central axis AX enter the first lens portion through the light incident surface of the first lens portion and are refracted at tilt angles even closer to the radial directions through the slant surface constituting the light exit surface of the first lens portion. Then, the light rays enter the second lens portion. That is, variations in angle of light rays traveling in the radial directions are reduced to make uniform the angles of the light rays through the light exit surface of the first lens portion. In addition, by properly slanting the outer circumferential surface of the second lens portion, light rays passing through the first lens portion and reaching the outer circumferential surface of the second lens portion can be totally reflected to exit from the light exit surface of the second lens portion. In this case, it is possible to increase the directivity of light rays exiting from the lens member by correcting the exit directions of the light rays to directions parallel to the central axis.

The lens member may include a hollow space defined by the conical surface constituting the light exit surface of the first lens portion and the inner circumferential surface of the second lens portion.

The light incident surface of the first lens portion may include a plane portion centered at the central axis.

The second lens portion may include a light exit surface extending parallel to the light incident surface of the first lens portion between the inner circumferential surface of the second lens portion and the outer circumferential surface of the second lens portion.

The light incident surface of the first lens portion may include a concave surface comprising a plane portion centered at the central axis and a circumferential surface surrounding the plane portion.

The first lens portion may include a plurality of prisms formed on the circumferential surface of the light incident surface thereof, each prism including a light entrance surface receiving light from the light source and a reflective surface positioned outward of the light entrance surface in the radial directions perpendicular to the central axis, the reflective surface totally reflecting the light received through the light entrance surface toward the light exit surface of the second lens portion.

The plurality of prisms may be disposed concentrically about the central axis.

The lens member may include a third lens portion disposed to face the conical surface constituting the light exit surface of the first lens portion, the third lens portion being disposed adjacent to the light exit surface of the second lens portion so as to close the hollow space.

The third lens portion may include a convex lens portion centered at the central axis, the convex lens portion being disposed to face the light exit surface of the first lens portion.

The third lens portion may include a plurality of prisms provided around the convex lens portion and concentrically about the central axis, each prism including a light entrance surface receiving light exiting from the light exit surface of the first lens portion and a light reflective surface reflecting the received light to direct the light forward in a direction of extension of the central axis.

The first lens portion and the second lens portion may be integrally formed together.

The third lens portion may be fitted to the inner circumferential surface of the second lens portion.

The inner circumferential surface of the second lens portion may slant at an angle set between the central axis and the radial directions perpendicular to the central axis. That is, the inner circumferential surface of the second lens portion may be a slant surface opening toward the light exit surface of the second lens portion from the circumferential edge of the conical surface constituting the light exit surface of the first lens portion.

The circumferential surface of the light incident surface of the first lens portion may be a Fresnel lens.

The Fresnel lens may be transformed from a TIR lens including a concave light incident surface and a convex light reflecting surface positioned to surround the outside of the light incident surface, the light incident and reflecting surfaces of the TIR lens being divided into a plurality of light incident regions and a plurality of light reflecting regions, respectively, disposed concentrically about the central axis, the light incident areas and light reflecting areas being reconstructed to constitute light entrance surfaces and reflective surfaces of the prisms, respectively, defining the Fresnel lens.

In addition, the present invention provides an optical unit including the above-described lens member and a light source disposed to face the light incident surface of the first lens portion of the lens member. The outer circumferential surface of the second lens is configured to totally reflect light that has exited the light exit surface of the first lens and reached the outer circumferential surface of the second lens through the inner circumferential surface of the second lens to direct the light forward in a direction of extension of the central axis.

In addition, the present invention provides an optical unit including the above-described lens member, a frame member supporting the lens member, and a light source disposed inside the frame member to face the light incident surface of the first lens portion of the lens member.

The conical surface of the first lens portion may be a curved surface.

Embodiments of the present invention will be explained below with reference to the accompanying drawings. It should be noted that the scale of the figures used in the following explanation is properly changed to show each member in a recognizable size.

DETAILED DESCRIPTION OF THE INVENTION

Figure 1:
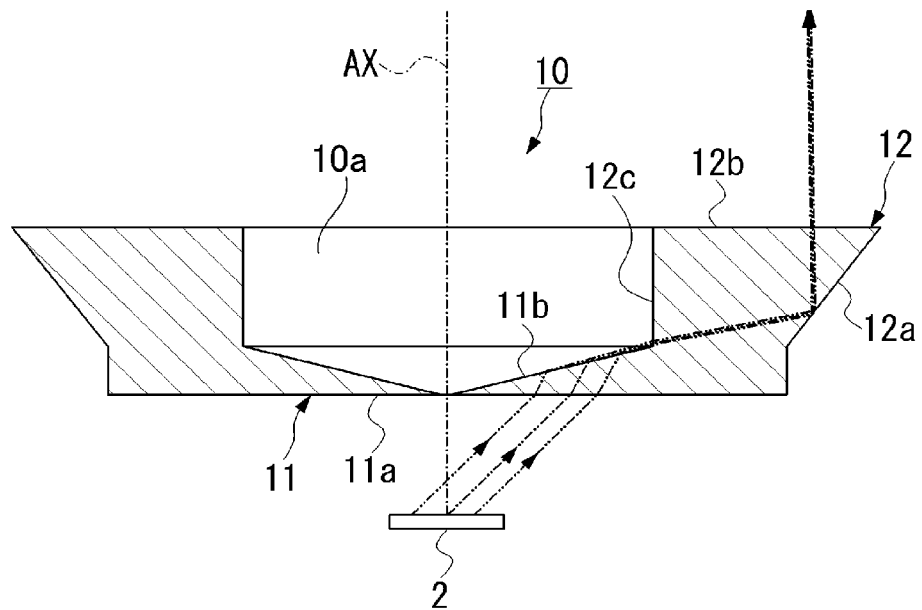
FIG. 1 is a sectional view of a lens member according to an embodiment of the present invention and illustrating an optical path of light rays emitted from a light source and passing through the lens member.
Figure 2:
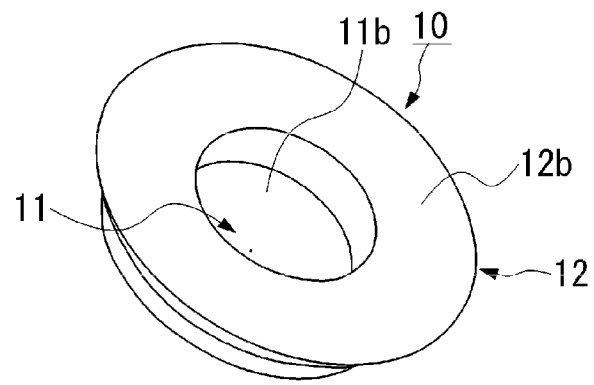
FIG. 2 is a perspective view of the lens member shown in FIG. 1.

As shown in FIG. 1, a lens member 10 according to a first embodiment of the present invention has a central axis AX and comprises a first lens portion 11 and a second lens portion 12. As shown in FIGS. 1 and 2, the first lens portion 11 has a light incident surface 11a disposed to face a light source 2 and a light exit surface 11b opposite to the light incident surface 11a. The light exit surface 11b of the first lens portion 11 includes a conical surface centered at the central axis AX and slanted so that the distance between the conical surface and the light incident surface 11a increases as the distance from the central axis AX increases outward in radial directions that are perpendicular to the central axis AX. The second lens portion 12 has an inner circumferential surface 12c extending in parallel with the central axis AX from an outer circumferential edge of the light exit surface 11b of the first lens portion 11. The second lens portion 12 further has an outer circumferential surface 12a centered at the central axis AX and positioned outward of the inner circumferential surface 12c in the radial directions that are perpendicular to the central axis AX.

It should be noted that the central axis AX is an imaginary line passing through the center of the lens member 10. The lens member 10 is made of a light-transmitting material, e.g. an acrylic resin. The first lens portion 11 and the second lens portion 12 are integrally molded together.

The light incident surface 11a of the first lens portion 11 includes a plane portion centered at the central axis AX. The plane portion is disposed to face the light-emitting surface of the light source 2. It should be noted that the light source 2 is disposed to face the lens member 10 and the center of the light-emitting surface of the light source 2 is disposed to coincide with the central axis AX of the lens member 10. The light exit surface 11b of the first lens portion 11 of the lens member 10 is slanted relative to the central axis AX and the light exit surface 11b refracts light rays that is emitted from the light source 2 and received through the light incident surface 11a to exit at angles closer to the radial directions that are perpendicular to the central axis AX than the central axis AX. It should be noted that the conical surface constituting the light exit surface 11b of the first lens portion 11 may be replaced by a quadratic surface, e.g. a paraboloic surface, a hyperbolic surface, or an ellipsoidal surface.

The inner circumferential surface 12c of the second lens portion 12 receives light emitted from the light exit surface 11b of the first lens portion 11 and directs the light toward the outer circumferential surface 12a of the second lens portion 12. The outer circumferential surface 12a totally reflects the light that is received through the inner circumferential surface 12c as shown in FIG. 1, totally reflecting the light in the direction of extension of the central axis AX away from the light incident surface 11a of the first lens portion 11.

In the illustrated embodiment, the inner circumferential surface 12c of the second lens portion 12 is a circular cylindrical surface extending substantially parallel to the central axis AX from the outer circumferential edge of the slant surface constituting the light exit surface 11b of the first lens portion 11. The outer circumferential surface 12a of the second lens portion 12 is a slant surface centered at the central axis AX and slanting relative to the central axis AX. The outer circumferential surface 12a may be a quadratic surface, e.g. a parabolic surface, a hyperbolic surface, or an ellipsoidal surface.

The second lens portion 12 has a light exit surface 12b extending in the radial directions perpendicular to the central axis AX between the inner circumferential surface 12c and the outer circumferential surface 12a. Specifically, the light exit surface 12b extends from the forward end edge of the inner circumferential surface 12c outward in the radial directions perpendicular to the central axis AX to form a flat surface that extends parallel to and opposite to the light incident surface 11a of the first lens portion 11.

The lens member 10 has a hollow space 10a defined by the conical surface constituting the light exit surface 11b of the first lens portion 11 and the inner circumferential surface 12c of the second lens portion 12, the hollow space centered at the central axis AX.

Figure 3:
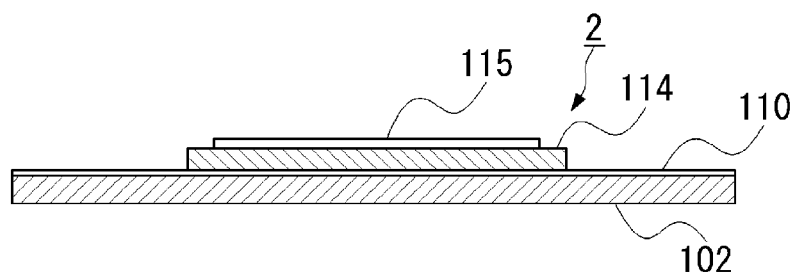
FIG. 3 is an enlarged sectional view of the light source shown in FIG. 1.
Figure 4:
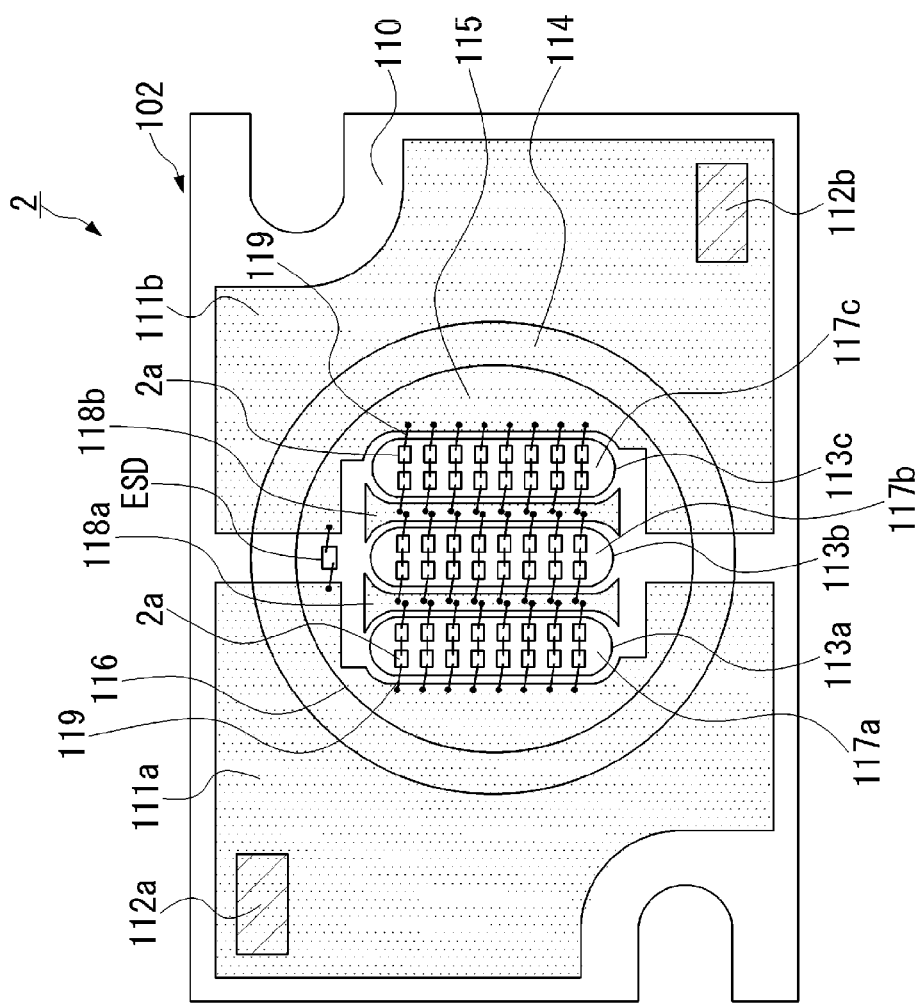
FIG. 4 is a plan view of the light source shown in FIG. 3.

The light source 2 is, for example, an LED light source comprising a plurality of LED elements. As shown in FIGS. 3 and 4, the light source 2 may comprise a thermally conductive base 102 made of an aluminum material or the like, a sheet-shaped insulating plate 110 fixed to the surface of the base 102, and a plurality of LED elements 2a mounted directly on the surface of the base 102 within through-holes 113a, 113b and 113c provided in the insulating plate 110. The insulating plate 110 is a printed circuit board made of a BT (Bismaleimide Triazine) resin or a glass epoxy material, for example, and has electrically conducting layers 111a, 111b, 118a and 118b of copper foil, for example, covering most of the surface of the insulating plate 110. Of the four conducting layers, two conducting layers 111a and 111b include respective electrodes 112a and 112b, which are supplied with a driving voltage.

On the insulating plate 110, there is provided a thin ring-shaped frame 114. The frame 114 has a sealing member 115 filled and set inside the frame to seal the LED elements 2a and so forth. The sealing member 115 has a light-transmitting property and transmits light emitted from the LED elements 2a to exit to the outside. The sealing member 115 forms a circular light-emitting area 116 to define a circular light-emitting surface of the light source.

A large number of planarly disposed LED elements 2a are electrically connected to the conducting layers 111a and 111b through the independent conducting layers 118a and 118b and a plurality of wires 119.

In this example of a light source, eight rows of two series-connected LED elements 2a are mounted in each of the mounting areas 117a, 117b and 117c on the base 102. Accordingly, sixteen LED elements 2a are mounted in each of the mounting areas 117a, 117b and 117c and, in total, forty nine LED elements 2a are mounted on the base 102.

Reference symbol ESD denotes an Electro Static Discharge (ESD) element for protecting the LED elements 2a from static electricity and so forth, which comprises a Zener diode. The ESD element is connected between the conducting layers 111a and 111b.

Thus, the light source 2 has a large number of LED elements 2a mounted in the circular light-emitting area 116 of about 11 mm in diameter, for example. Therefore, it is possible to obtain high-intensity light from the light-emitting area 116 and hence possible to obtain a light source of high lumen density. The reason why a large number of LED elements 2a can be collectively mounted in the light-emitting area 116 is that the mutually adjacent LED elements 2a are series-connected by directly wiring them through the wires 119. It should be noted that the light source used in association with the lens member of the present invention is not limited to the above-described one in terms of the number of LED elements, the size of the light-emitting surface, etc., and that the foregoing light source 2 is one example of a light source including a plurality of LED elements.

The following is an explanation of the entrance and exit of light in the case of using the lens member 10 of this embodiment together with the light source 2.

As shown in FIG. 1, for example, light rays emitted from the light source 2 are received through the light incident surface 11a of the first lens portion 11, which faces the light source 2, and refracted to exit through the light exit surface 11b outward in the radial directions perpendicular to the central axis AX at angles close to the critical angle. Thereafter, the light rays exiting the first lens portion 11 enter the second lens portion 12 through the inner circumferential surface 12c and are totally reflected at the outer circumferential surface 12a toward the light exit surface 12b.

That is, in the lens member 10, light rays emitted from the light source 2 at angles of about 55° to the central axis AX of the lens member 10 are temporarily refracted through the first lens portion 11 before entering the second lens portion 12 to control the light directivity. It should be noted that the center of the light-emitting surface of the light source 2 is disposed to coincide with the central axis AX of the lens member 10.

Figure 5:
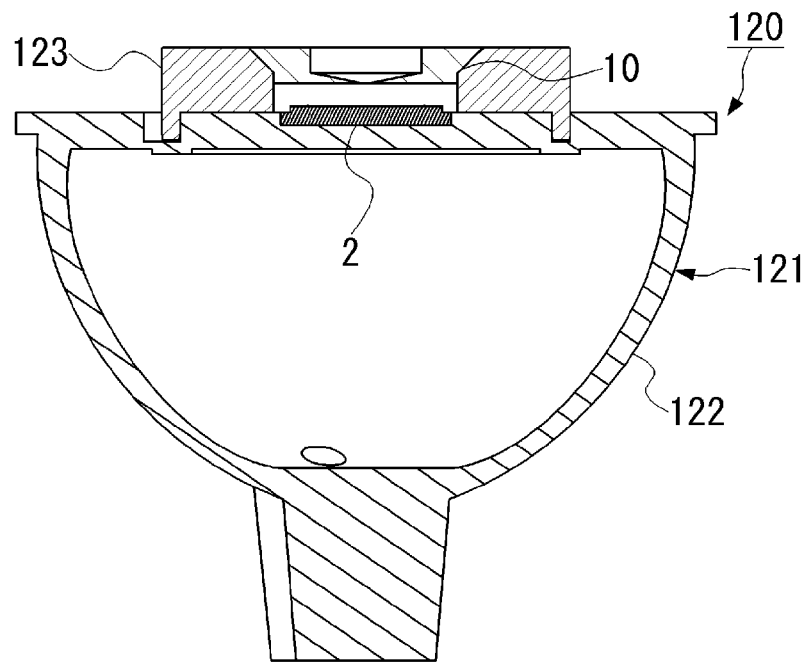
FIG. 5 is a sectional view of an optical unit incorporated with the lens as shown in FIG. 1 and a light source.
Figure 6:
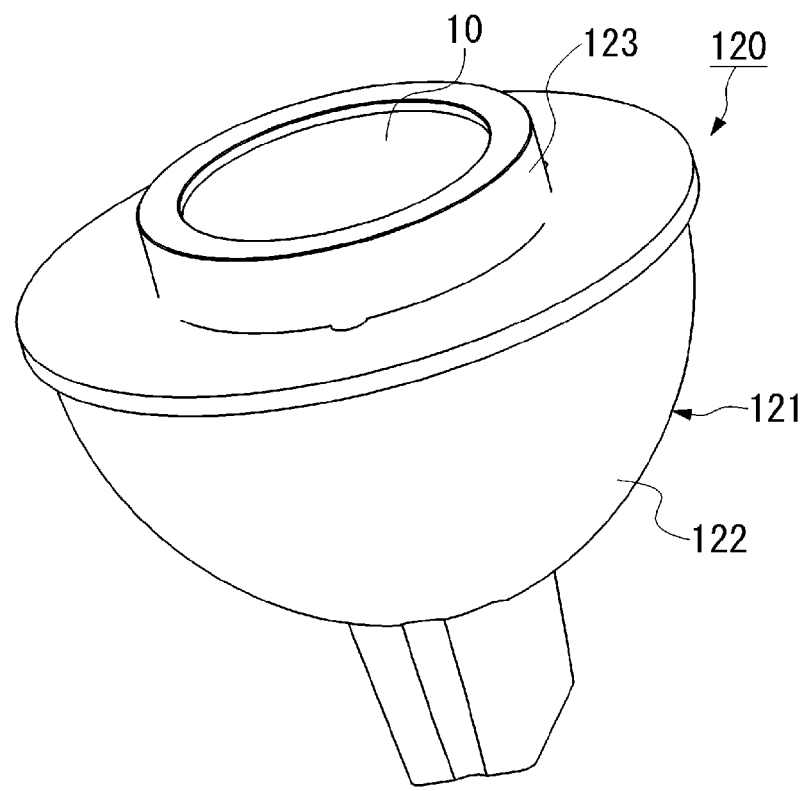
FIG. 6 is a perspective view of the optical unit of FIG. 5.

FIGS. 5 and 6 show one example of an optical unit 120 according to an embodiment of the present invention that has a light source 2 and the lens member 10. As illustrated in the figures, the optical unit 120 has a hemispherical frame body 121, and the light source 2 is attached to the center of a circular end wall 122 of the hemispherical frame body 121. The lens member 10 is supported by a frame member 123 provided on the circular end wall 122 of the frame body 121 and the light source 2 is surrounded by the frame member 123. The frame member 123 is disposed on the circular end wall 122 so that the central axis AX of the lens member 10 is aligned with the center of the light source 2.

Figure 7:
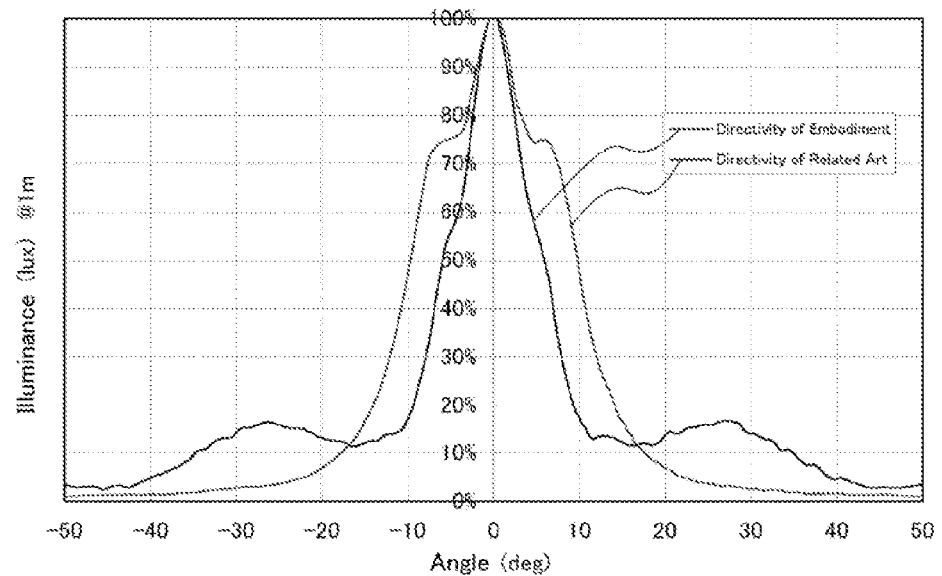
FIG. 7 is a graph showing directivity of light passing through the optical unit of FIG. 5 in contrast with directivity of light passing through a conventional optical unit.
Figure 14:
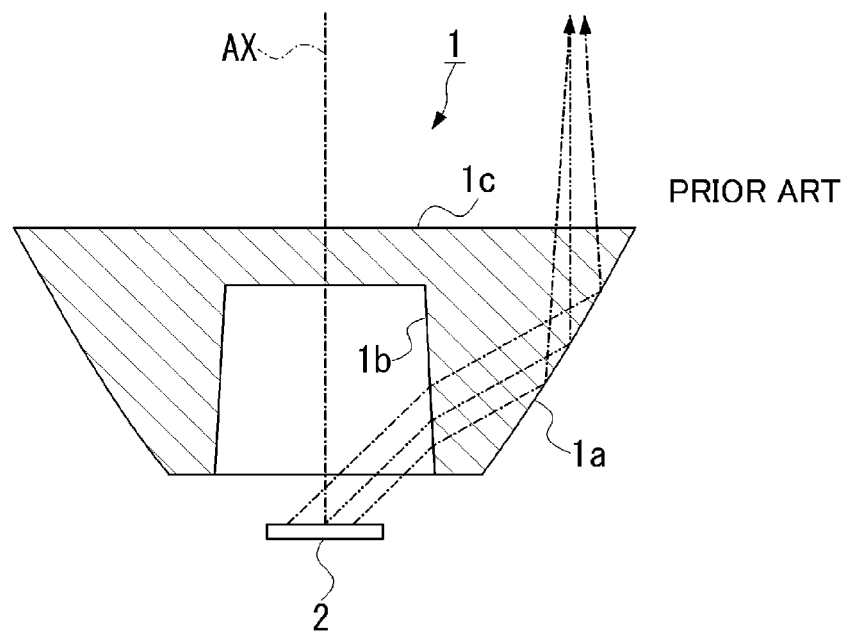
FIG. 14 is a sectional view of a conventional TIR lens and a light source.

FIG. 7 is a graph showing results of measurement of the light directivity of the optical unit according to the foregoing embodiment and the light directivity of the related-art optical unit shown in FIG. 14. As will be understood from the measurement results, the related-art optical unit has a half bandwidth of 20° (±10°), whereas the optical unit of this embodiment exhibits a half bandwidth of 10° (±5°). Thus, the optical unit according to the embodiment of the present invention shows high directivity.

As has been stated above, the lens member 10 of the foregoing embodiment refracts and collects light from a light source 2 through the light exit surface 11b of the first lens portion 11 and make the collected light totally reflected in the second lens portion 12 to direct light forward in the direction of the central axis AX. Accordingly, highly collected light can be obtained even if the light source 2 has a large light-emitting surface area. Consequently, the optical unit provides increased light luminance. In addition, the light-emitting surface of the light source 2 can be seen small without spreading light in different directions. Thus, the color irregularity of the light source 2 can be reduced.

The optical unit 120 of this embodiment provides highly directed and highly collected output light even when the light source 2 is an LED light source including a plurality of LED elements 2a that are planarly disposed to obtain a large light-emitting surface area. Thus, it is possible to obtain satisfactory LED optical products including lighting devices, projectors, flashlights, and automotive headlights and taillights, which are capable of highly collecting and efficiently utilizing light emitted from a light source including LED elements.

Next, second and third embodiments of the lens member and optical unit according to the present invention will be explained below with reference to FIGS. 8 to 13. It should be noted that, in the following explanation of the second and third embodiments, the same constituent elements as those of the foregoing first embodiment are denoted by the same reference numerals as used in the first embodiment, and redundant explanation is omitted.

Figure 8:
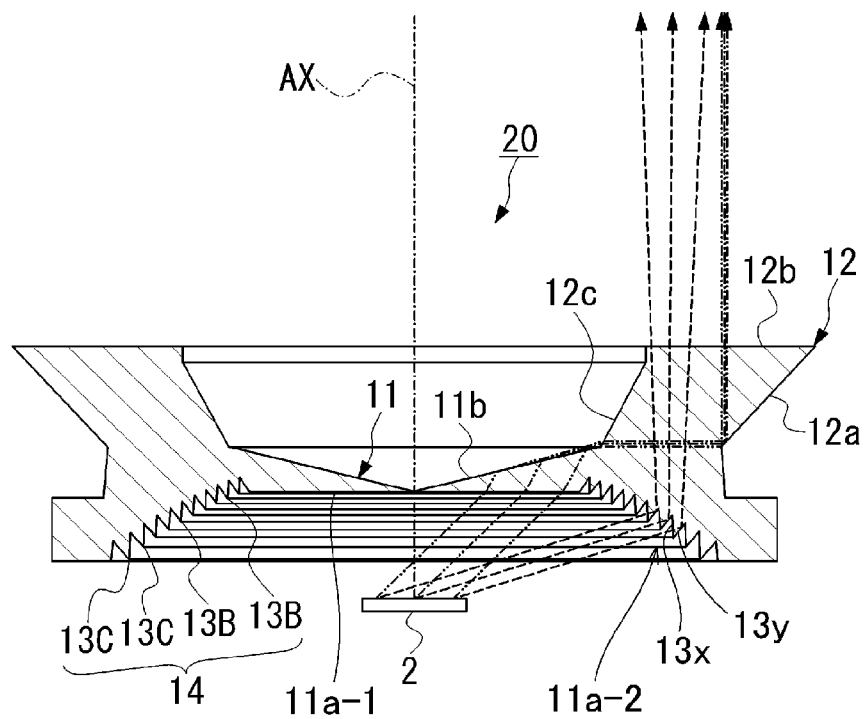
FIG. 8 is a sectional view of a lens member according to a second embodiment of the present invention and illustrating an optical path of light rays emitted from a light source and passing through the lens.

The second embodiment differs from the first embodiment in the following point. In the first embodiment, the light incident surface 11a of the first lens portion 11, which faces the light source 2, is a simple flat surface. In the lens member 20 of the second embodiment, as shown in FIG. 8, the light incident surface 11a of the first lens portion 11, which faces the light source 2, has a generally concave surface comprising a plane portion 11a-1 centered at the central axis AX and a circumferential surface 11a-2 surrounding the plane portion 11a-1. The circumferential surface 11a-2 of the light incident surface 11a is provided with a plurality of prisms 13B and 13C that are disposed concentrically about the central axis AX to form a Fresnel lens portion 14 in which each prism has a light entrance surface 13x receiving light from the light source 2 and a reflective surface 13y positioned outward of the light entrance surface 13x in the radial directions perpendicular to the central axis AX. The reflective surface 13y totally reflects the light from the light source 2 received through the light entrance surface 13x toward the light exit surface 12b of the second lens portion 12. In FIG. 8, light rays entering the plane portion 11a-1 of the light incident surface 11a of the first lens portion 11 are shown by the two-dot chain lines, and light rays entering the Fresnel lens 14 are shown by the broken lines.

Figure 9:
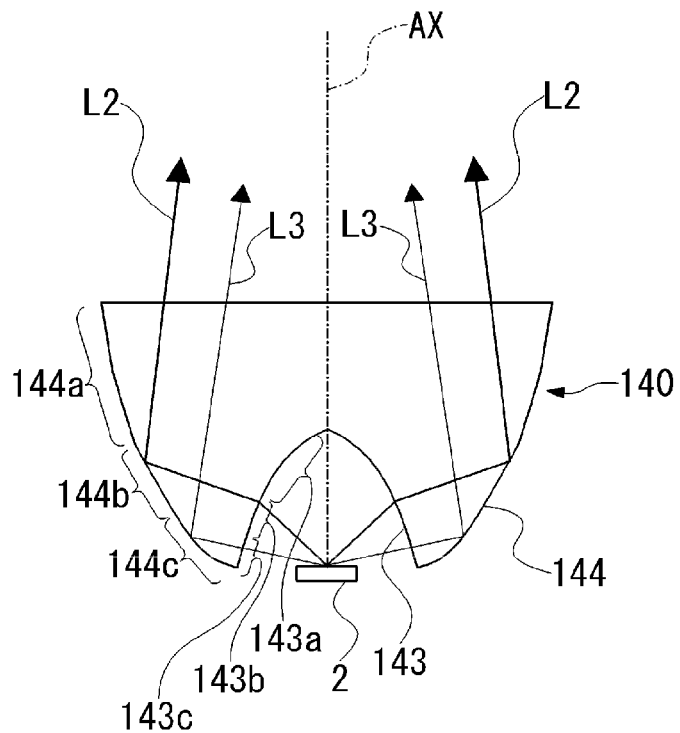
FIG. 9 is an explanatory view illustrating the principle of a TIR lens corresponding to a Fresnel lens portion included in a first lens portion of the lens member shown in FIG. 8.
Figure 10:
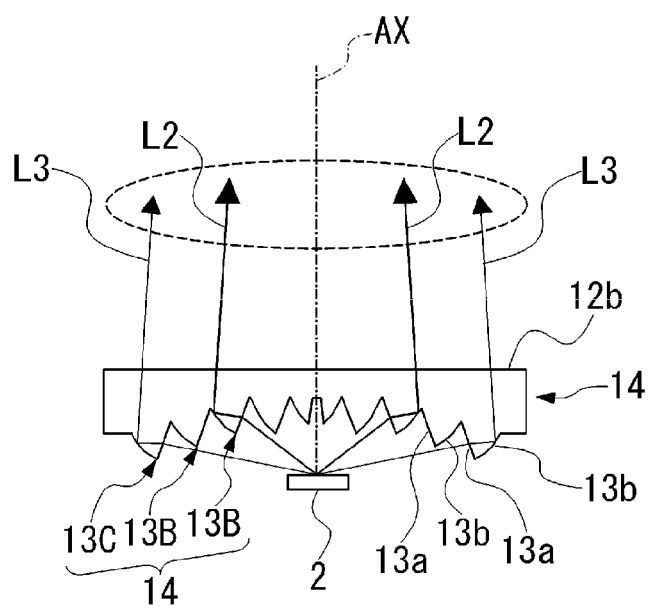
FIG. 10 is an explanatory view illustrating a Fresnel lens transformed from the TIR lens of FIG. 9.

The Fresnel lens portion 14 optically corresponds to a TIR lens 140 as shown in FIG. 9. The TIR lens 140 has a concave light incident surface 143 centered at the central axis AX of the TIR lens 140 and a convex light reflecting surface 144 surrounding the outside of the light incident surface 143 in radial directions perpendicular to the central axis AX. The light incident surface 143 and light reflecting surface 144 of the TIR lens 140 are divided and reconstructed into a plurality of prisms to constitute a Fresnel lens. In the TIR lens 140, light from the light source 2 is refracted through the concave light incident surface 143 and totally reflected at the convex light reflecting surface 144 to exit from a light exit surface opposite to the light incident surface 143 in the direction of extension of the central axis AX. FIG. 10 shows a Fresnel lens transformed from the TIR lens 140 by dividing and reconstructing the light incident surface 143 and light reflecting surface 144 of the TIR lens 140 into a plurality of concentric prisms each of which has a light entrance surface 13a as a divided part of the light incident surface 143 of the TIR lens 140 and a reflective surface 13b as a divided part of the light reflecting surface 144 of the TIR lens 140. The reflective surface 13b is positioned outward of the light entrance surface 13a in the radial directions perpendicular to the central axis AX. This Fresnel lens surface is incorporated into the light incident surface 11a of the first lens portion 11 of the lens member so that light emitted from the light source 2 slantingly in the radial directions perpendicular to the central axis AX is received through the light entrance surface 13x of each prism and reflected at the reflective surface 13y of the each prism and thus can be directed forward in a direction parallel to the central axis AX.

As will be understood from FIGS. 9 and 10, a divided region of the convex light reflecting surface 144 that is positioned at the radially outermost position from the central axis AX in the TIR lens 140 shown in FIG. 9 is disposed at the radially innermost position closest to the central axis AX in the Fresnel lens surface shown in FIG. 10.

In the illustrated embodiment, the concave light incident surface 143 is divided into divided regions 143a, 143b and 143c in the mentioned order from the inner side. The convex light reflecting surface 144 is divided into divided regions 144c, 144b and 144a in the mentioned order from the inner side. The prisms 13B and 13C constituting the Fresnel lens portion 14 of the lens member 20 shown in FIG. 8 respectively correspond to the divided regions 143b and 143c of the concave light incident surface 143 of the TIR lens 140 except the central divided region 143a and respectively correspond to the divided regions 144b and 144c optically associated with the divided regions 143b and 143c, respectively.

Although the prism light entrance surface 13x and the prism reflective surface 13y may be in the shape of a plane surface or a quadratic surface such as a paraboloid, a hyperboloid or an ellipsoid, it is preferable in terms of productivity to make the light entrance and reflective surfaces 13x and 13y in the shape of a plane or substantially plane surface.

The following is an explanation of the entrance and exit of light from the light source 2 relative to the Fresnel lens portion 14 of the lens member 20 of this embodiment.

In the TIR lens 140 shown in FIG. 9, a relatively high-intensity light ray L2 emitted from the light source 2 somewhat obliquely to the central axis AX enters through the divided region 143b of the concave light incident surface 143 and is totally reflected at the divided region 144b of the convex light reflecting surface 144 to exit from an outer region of the light exit surface. In contrast, in the lens member 20 of this embodiment, as shown in FIG. 10, a relatively high-intensity light ray L2 emitted from the light source 2 somewhat obliquely to the central axis AX enters through the light entrance surface 13x of the inner prism 13B and is then totally reflected at the reflective surface 13y of the prism 13B to pass through the second lens portion between the inner circumferential surface 12c and outer circumferential surface 12a of the second lens portion and exit from the light exit surface 12b of the second lens portion.

In the above-described TIR lens 140, a relatively low-intensity light ray L3, that is obliquely emitted from the light source 2 at a larger angle relative to the central axis AX than the relatively high-intensity light ray L2, enters through the divided region 143c of the concave light incident surface 143 and is then totally reflected at the divided region 144c of the convex light reflecting surface 144 to exit from a circumferential region of the central portion of the light exit surface. In contrast, in the lens member 20 of this embodiment, a relatively low-intensity light ray L3 that is obliquely emitted from the light source 2 at a larger angle relative to the central axis AX than the relatively high-intensity light ray L2, enters through the light entrance surface 13a of the outer prism 13C and is then totally reflected at the reflective surface 13b of the prism 13C to exit from the neighborhood of the outer edge of the light exit surface.

As stated above, in the lens member 20 of this embodiment, the Fresnel lens portion 14 has a structure in which the prisms including the reflective surfaces corresponding to progressively outer divided regions of the convex light reflecting surface 144 are disposed at progressively inner regions of the Fresnel lens portion 14, and the prisms including the reflective surfaces corresponding to progressively inner divided regions of the convex light reflecting surface 144 are disposed at progressively outer regions of the Fresnel lens portion 14. Consequently, an inner light ray of higher intensity entering through the light entrance surface of an inner prism is totally reflected at the reflective surface of the inner prism.

Accordingly, a high-intensity light ray, which exits from a radially outer region in the related-art TIR lens 140 or Fresnel lens 14, is made to exit from a radially inner region in the Fresnel lens portion 14 of the lens member 20 of this embodiment. The mutually associated light entrance and reflective surfaces 13x, 13y of each prism are contiguously formed through a ridge so that light entering through the light entrance surface can reach the associated reflective surface through a short path. Therefore, it is possible to greatly increase the utilization efficiency of light entering and exiting each prism. It should be noted that light-collecting properties can also be further improved by increasing the number of divided regions when forming the Fresnel lens portion 14.

Because the prism reflective surface 13y is formed from a plane surface, the Fresnel lens portion 14 can be easily designed and the lens member 20 with the Fresnel lens portion 14 can be produced at reduced cost. In addition, because the prism light entrance surface 13x is directed toward the light source 2 at a tilt with respect to the central axis AX, it is easy for light to enter the prism light entrance surface 13x, and because the prism light entrance surface 13x and the central axis AX are not parallel to each other, it is possible to improve mold releasability when the lens member 20 is manufactured by molding process and hence possible to obtain a lens member 20 of good quality.

Figure 11:
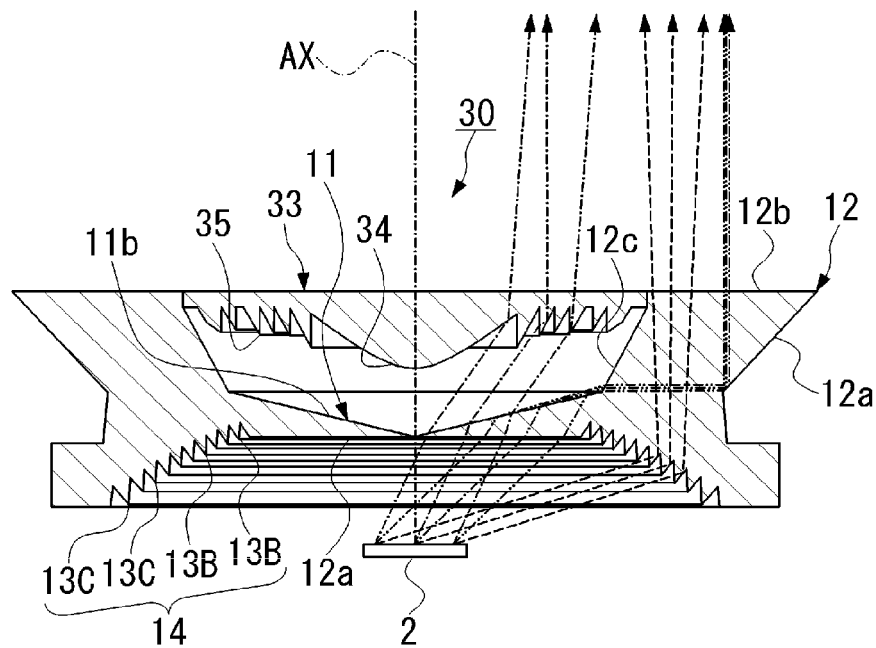
FIG. 11 is a sectional view of a lens member according to a third embodiment of the present invention illustrating optical paths of light rays emitted from the light source and passing through the lens member.

A lens member 30 according to the third embodiment shown in FIG. 11 differs from the second embodiment in the following point. In the second embodiment, the hollow space defined by the light exit surface 11b of the first lens portion 11 and the inner circumferential surface 12c of the second lens portion 12 opens at a position opposite to the light exit surface 11b of the first lens portion 11 in the direction of extension of the central axis AX. In the lens member 30 of the third embodiment, a third lens portion 33 is additionally provided, which is disposed in the hollow space to face the light exit surface 11b of the first lens portion 11. The third lens portion 33 collects light of the light source 2 that passes through the first lens portion 11 and reaches the third lens portion 33 to direct the light to exit in the direction of extension of the central axis AX. It should be noted that the third lens portion 33 is made as an individual member separate from the first and second lens portions that are integrally formed together, and disposed to face the light exit surface 11b of the first lens portion 11. The third lens portion 33 is fitted into the hollow space and disposed adjacent to the light exit surface 12b of the second lens portion 12 to close the hollow space.

The third lens portion 33 has a convex lens portion 34 centered at the central axis AX and a Fresnel lens portion 35 concentrically disposed around the convex lens portion 34 relative to the central axis AX. The Fresnel lens portion 35 comprises a plurality of annular prisms concentrically disposed around the central convex lens portion 34 relative to the central axis AX. The convex lens portion 34 may be a convex refracting lens including an spherical surface, for example. In FIG. 11, rays of light entering the first lens portion 11 and then entering the second lens portion 12 are shown by the two-dot chain lines, and rays of light entering the second lens portion 12 through the Fresnel lens portion 14 of the light incident surface 11a of the first lens portion 11 are shown by the broken lines. Light rays entering the third lens portion 33 are shown by the one-dot chain line.

The above-described lens member 30 of the third embodiment provides the following advantage. Among light rays emitted from the light source 2 in various directions over a range of from a direction parallel to the central axis AX, or the direction of the central axis AX, to radial directions perpendicular to the central axis AX, light rays emitted in directions closer to the central axis AX pass through the plane portion of the light incident surface 11a of the first lens portion 11 and enter the third lens portion 33. That is, light rays passing through the first lens portion 11 and passing through the hollow space 10a, without entering the second lens portion 12, to enter the third lens portion 33 are collected and directed to become even closer to the central axis AX through the third lens portion 33. Thus, the light-collecting properties and the light utilization efficiency can be further improved.

Although in the third embodiment the third lens portion 33 comprises a convex lens portion 34 including a downwardly convex a spherical surface and a downwardly projecting Fresnel lens portion 35, it should be noted that the third lens portion 33 is not limited to the described structure but may comprise, for example, one of a convex lens portion that is upwardly convex, a convex lens portion that is downwardly convex, and a conventional Fresnel lens formed on the upper or lower surface, or a plurality of them in combination.

Figure 12:
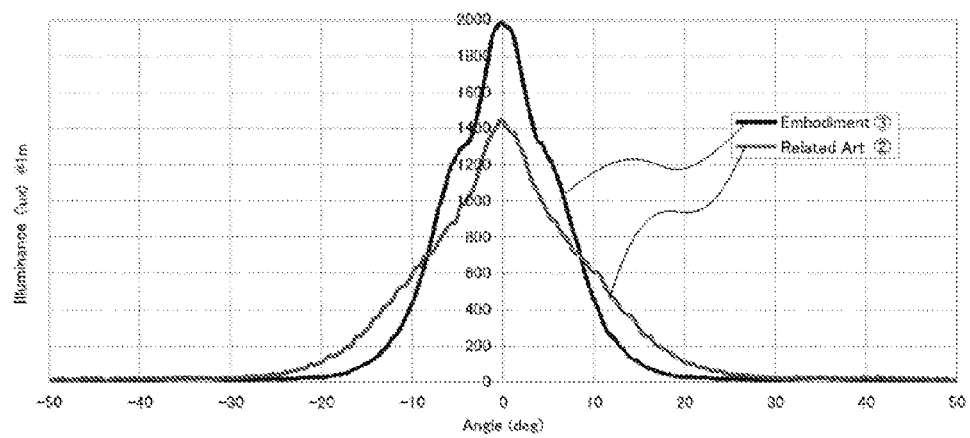
FIG. 12 is a graph showing directivity of light passing through an optical unit comprising the lens member and a light source as shown in FIG. 11.
Figure 13:
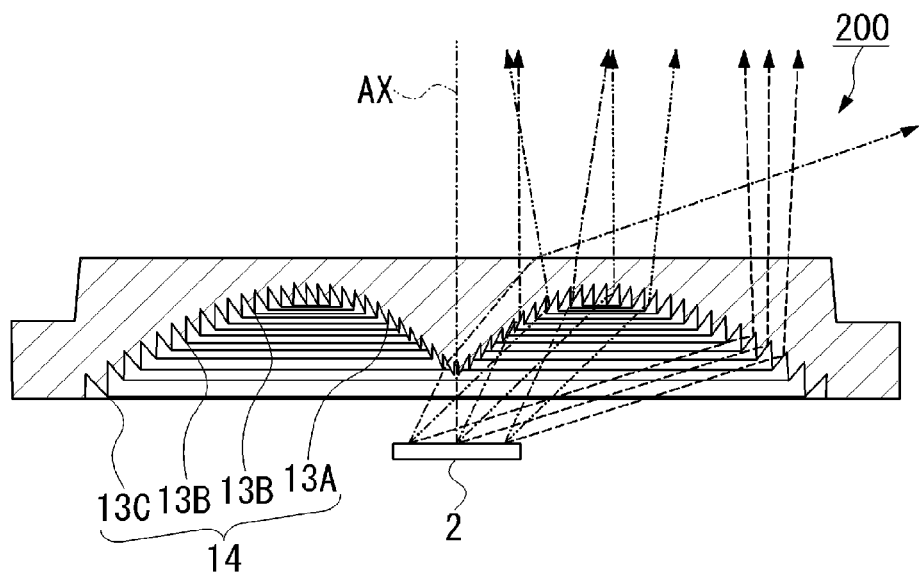
FIG. 13 is a sectional view of a lens member used in FIG. 12, in comparison with the lens member included in the optical unit of FIG. 11*h*.

FIG. 12 shows a result of measurement of the directivity of the optical unit using the lens member 30 in the third embodiment. FIG. 12 also shows a result of measurement of the directivity of an optical unit using a lens member 200 as shown in FIG. 13 for comparative purposes. In the lens member 200, the first lens portion 11 is not provided with a plane portion centered at the central axis AX such as that provided in the lens member 30 of the third embodiment, but instead the whole of the light incident surface facing the light source 2 comprises the above-described Fresnel lens portion 14 in which there are additionally provided prisms 13A corresponding to the combinations of the central divided region 143a of the concave lens portion 143 of the TIR lens 140 shown in FIG. 9 and the divided region 144a of the convex lens portion 144, which is associated with the divided region 143a. As will be understood from the results of the directivity measurement, the lens member 30 of the third embodiment exhibits higher directivity than the lens member 200 of the comparative example and hence provides improved light-collecting properties and increased front illuminance.

Thus, the lens member 30 of the third embodiment has the third lens portion 33 that collects and emanates rays of light from the light source 2 passing through the first lens portion 11 and entering the third lens portion 33 in the direction of the central axis AX. Accordingly, light rays passing through the first lens portion 11 to exit at small angles to the central axis AX are further converged through the third lens portion 33. Consequently, the light-collecting properties and the light utilization efficiency can be further improved.

Regarding the third lens portion 33 and the lens member 200 disclosed in FIG. 13, the substantial contents thereof are disclosed in US2010/0284194A1, the entire contents of which are incorporated by reference herein. It should be noted that the present invention is not limited to the foregoing embodiments but can be modified in a variety of ways without departing from the scope of the present invention.

The invention claimed is:

1. A lens member comprising:
a central axis;
a first lens portion including a light incident surface disposed to face a light source, and a light-refracting surface opposite to the light incident surface, the light-refracting surface including a conical surface centered at the central axis and slanted so that a distance between the conical surface and the light incident surface increases as a distance from the central axis increases outward in radial directions perpendicular to the central axis; and
a second lens portion including an inner circumferential surface extending around the central axis from an outer circumferential edge of the conical surface of the first lens portion, and an outer circumferential surface centered at the central axis and positioned outward of the inner circumferential surface in the radial directions perpendicular to the central axis,
wherein the inner circumferential surface of the second lens portion is a circular cylindrical surface extending substantially parallel to the central axis from the outer circumferential edge of the conical surface of the first lens portion.

2. The lens member of claim 1, wherein the outer circumferential surface of the second lens portion slants at an angle set between the central axis and the radial directions perpendicular to the central axis.

3. The lens member of claim 1, further comprising:
a hollow space defined by the conical surface constituting the light-refracting surface of the first lens portion and the inner circumferential surface of the second lens portion.

4. A lens member comprising:
a central axis;
a first lens portion including a light incident surface disposed to face a light source, and a light-refracting surface opposite to the light incident surface, the light-refracting surface including a conical surface centered at the central axis and slanted so that a distance between the conical surface and the light incident surface increases as a distance from the central axis increases outward in radial directions perpendicular to the central axis; and
a second lens portion including an inner circumferential surface extending around the central axis from an outer circumferential edge of the conical surface of the first lens portion, and an outer circumferential surface centered at the central axis and positioned outward of the inner circumferential surface in the radial directions perpendicular to the central axis,
wherein the light incident surface of the first lens portion includes a plane portion centered at the central axis.

5. The lens member of claim 4, wherein the second lens portion has a light exit surface extending parallel to the light incident surface of the first lens portion between the inner circumferential surface of the second lens portion and the outer circumferential surface of the second lens portion.

6. The lens member of claim 4, wherein the light incident surface of the first lens portion comprises a concave surface including the plane portion centered at the central axis and a circumferential surface surrounding the plane portion.

7. The lens member of claim 6, wherein a plurality of prisms are formed on the circumferential surface of the light incident surface of the first lens portion, each of the prisms including a light entrance surface that receives light from the light source and a reflective surface positioned outward of the light entrance surface in the radial directions perpendicular to the central axis, the reflective surface totally reflecting the light received through the light entrance surface toward a light exit surface of the second lens portion.

8. The lens member of claim 7, wherein the plurality of prisms are disposed concentrically around the central axis.

9. A lens member comprising:
a central axis;
a first lens portion including a light incident surface disposed to face a light source, and a light-refracting surface opposite to the light incident surface, the light-refracting surface including a conical surface centered at the central axis and slanted so that a distance between the conical surface and the light incident surface increases as a distance from the central axis increases outward in radial directions perpendicular to the central axis;
a second lens portion including an inner circumferential surface extending around the central axis from an outer circumferential edge of the conical surface of the first lens portion, and an outer circumferential surface centered at the central axis and positioned outward of the inner circumferential surface in the radial directions perpendicular to the central axis;

a hollow space defined by the conical surface constituting the light-refracting surface of the first lens portion and the inner circumferential surface of the second lens portion; and a third lens portion disposed to face the conical surface constituting the light-refracting surface of the first lens portion, the third lens portion being disposed adjacent to a light exit surface of the second lens portion so as to close the hollow space.

10. The lens member of claim 9, wherein the third lens portion has a convex lens portion centered at the central axis, the convex lens portion being disposed to face the light-refracting surface of the first lens portion.

11. The lens member of claim 10, wherein the third lens portion has a plurality of prisms provided around the convex lens portion and concentrically around the central axis, each of the prisms including a light entrance surface that receives light exiting from the light-refracting surface of the first lens portion and a light reflective surface that reflects the received light forward in a direction of extension of the central axis.

12. The lens member of claim 1, wherein the first lens portion and the second lens portion are integrally formed together.

13. The lens member of claim 9, wherein the third lens portion is fitted to the inner circumferential surface of the second lens portion.

14. The lens member of claim 4, wherein the inner circumferential surface of the second lens portion is a slant surface centered at the central axis and extending from the circumferential edge of the conical surface constituting the light-refracting surface of the first lens portion at a slant angle set between the central axis and the radial directions perpendicular to the central axis.

15. The lens member of claim 7, wherein the circumferential surface of the light incident surface of the first lens portion is a Fresnel lens.

16. The lens member of claim 15, wherein the Fresnel lens is transformed from a total internal reflection lens including a concave light incident surface and a convex light reflecting surface positioned to surround an outside of the light incident surface, the light incident surface and light reflecting surface of the total internal reflection lens being divided into a plurality of light incident regions and a plurality of light reflecting regions, respectively, disposed concentrically around the central axis, the light incident regions and the light reflecting regions being reconstructed to constitute light entrance surfaces and reflective surfaces of prisms, respectively, defining the Fresnel lens.

17. An optical unit comprising:
   a lens member comprising:
      a central axis;
      a first lens portion including a light incident surface disposed to face a light source, and a light-refracting surface opposite to the light incident surface, the light-refracting surface including a conical surface centered at the central axis and slanted so that a distance between the conical surface and the light incident surface increases as a distance from the central axis increases outward in radial directions perpendicular to the central axis; and
      a second lens portion including an inner circumferential surface extending around the central axis from an outer circumferential edge of the conical surface of the first lens portion, and an outer circumferential surface centered at the central axis and positioned outward of the inner circumferential surface in the radial directions perpendicular to the central axis; and
   a light source disposed to face the light incident surface of the first lens portion of the lens member;
   the outer circumferential surface of the second lens being configured to totally reflect light that is exited through the light-refracting surface of the first lens and reached the outer circumferential surface of the second lens through the inner circumferential surface of the second lens to direct the light forward in a direction of extension of the central axis.

18. The optical unit according to claim 17, further comprising:
   a frame member supporting the lens member; and
   a light source disposed inside the frame member to face the light incident surface of the first lens portion of the lens member.

19. The lens member of claim 4, wherein the conical surface of the first lens portion includes a curved surface.

* * * * *